(12) United States Patent
Azami et al.

(10) Patent No.: US 9,947,703 B2
(45) Date of Patent: Apr. 17, 2018

(54) SOLID-STATE IMAGING DEVICE, METHOD OF MANUFACTURING THE SAME, AND ELECTRONIC APPARATUS

(71) Applicant: SONY CORPORATION, Tokyo (JP)

(72) Inventors: Kenji Azami, Kanagawa (JP); Yusuke Otake, Kanagawa (JP); Yuko Ohgishi, Tokyo (JP); Toshifumi Wakano, Kanagawa (JP); Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/113,861

(22) PCT Filed: Feb. 5, 2015

(86) PCT No.: PCT/JP2015/053180
§ 371 (c)(1),
(2) Date: Jul. 25, 2016

(87) PCT Pub. No.: WO2015/125611
PCT Pub. Date: Aug. 27, 2015

(65) Prior Publication Data
US 2016/0351606 A1 Dec. 1, 2016

(30) Foreign Application Priority Data

Feb. 18, 2014 (JP) .................................. 2014-028064

(51) Int. Cl.
*H01L 27/146* (2006.01)
*H04N 5/374* (2011.01)
*H04N 5/353* (2011.01)

(52) U.S. Cl.
CPC .... *H01L 27/14614* (2013.01); *H01L 27/1461* (2013.01); *H01L 27/1464* (2013.01);
(Continued)

(58) Field of Classification Search
None
See application file for complete search history.

(56) References Cited

FOREIGN PATENT DOCUMENTS

| JP | 2010-157893 A | 7/2010 |
|---|---|---|
| JP | 2012-004443 A | 1/2012 |

(Continued)

*Primary Examiner* — Long Pham
(74) *Attorney, Agent, or Firm* — Chip Law Group

(57) ABSTRACT

The present disclosure relates to a solid-state imaging device that can be made smaller in size, a method of manufacturing the solid-state imaging device, and an electronic apparatus. The solid-state imaging device includes a photoelectric conversion film that performs photoelectric conversion of light emitted from the back surface side of the semiconductor substrate. Also, in each pixel, a charge accumulation layer is formed to be in contact with the photoelectric conversion film on the back surface of the semiconductor substrate, a transfer path unit is formed to extend from the charge accumulation layer to a point near the front surface of the semiconductor substrate, and a memory unit is disposed near the back surface side of the semiconductor substrate, with a charge transfer gate being interposed between the memory unit and the transfer path unit. Then, the photoelectric conversion film is formed by stacking a layer formed with a material having a great light blocking effect on the back surface of the semiconductor substrate. The present technology can be applied to back-illuminated CMOS image sensors in global shutter mode.

20 Claims, 12 Drawing Sheets

(52) U.S. Cl.
  CPC .. *H01L 27/14612* (2013.01); *H01L 27/14656* (2013.01); *H01L 27/14687* (2013.01); *H04N 5/353* (2013.01); *H04N 5/374* (2013.01)

(56) References Cited

FOREIGN PATENT DOCUMENTS

| JP | 2012-204524 A | 10/2012 |
|----|---------------|---------|
| WO | 2013/088983 A | 6/2013  |

SOLID-STATE IMAGING DEVICE, METHOD OF MANUFACTURING THE SAME, AND ELECTRONIC APPARATUS

CROSS REFERENCE TO RELATED APPLICATIONS

This application is a U.S. National Phase of International Patent Application No. PCT/JP2015/053180 filed on Feb. 5, 2015, which claims priority benefit of Japanese Patent Application No. 2014-028064 filed in the Japan Patent Office on Feb. 18, 2014. Each of the above-referenced applications is hereby incorporated herein by reference in its entirety.

TECHNICAL FIELD

The present disclosure relates to a solid-state imaging device, a method of manufacturing the solid-state imaging device, and an electronic apparatus, and more particularly, to a solid-state imaging device that can be made smaller in size, a method of manufacturing the solid-state imaging device, and an electronic apparatus.

BACKGROUND ART

In a conventional electronic apparatus having an imaging function, such as a digital still camera or a digital video camera, a solid-state imaging device like a charge coupled device (CCD) or a complementary metal oxide semiconductor (CMOS) image sensor is used. A solid-state imaging device has pixels each including a combination of a photodiode (PD) that performs photoelectric conversion and transistors, and an image is formed in accordance with pixel signals that are output from the pixels arranged in a two-dimensional fashion.

Also, these days, back-illuminated CMOS image sensors are often used. In a back-illuminated CMOS image sensor, light is emitted onto the PDs from the back surface side, which is the opposite side from the front surface side on which transistors and wiring layers are stacked on a semiconductor substrate.

In a CMOS image sensor, an image is normally taken in rolling shutter mode in which charge is sequentially transferred from PDs to floating diffusion (FD) units for each row of pixels. In recent years, however, CMOS image sensors that are capable of taking images in global shutter mode in which charge is transferred from PDs to FD units simultaneously from all the pixels have been developed.

Also, a structure in which a novel film material that serves as a photoelectric conversion unit and has a light blocking effect (such as CIGS: CuInGaS2) is stacked on a semiconductor substrate has been developed for back-illuminated CMOS image sensors in global shutter mode. In this structure, a charge accumulation unit that stores the charge generated in the photoelectric film is formed on the surface on the side of the photoelectric conversion film, and a memory unit and a signal processing transistor are formed on the surface on the side of the wiring layer of the semiconductor substrate. In this manner, area efficiency is increased. Also, for example, a vertical transistor is used in transferring charge from the charge accumulation unit to the memory unit (see Patent Document 1).

A global shutter operation can be performed with a structure using such a vertical transistor. In the structure, global resetting is performed via the FD unit and the memory unit after the charge in the memory unit is sequentially read out. Because of such a structure, the frame rate drops. To increase the frame rate, two vertical transistors are necessary, and therefore, the area efficiency of the CMOS image sensor becomes lower. Further, when the charge accumulation unit is saturated, the path for releasing the charge needs to be formed in the power supply on the wiring layer side or in adjacent pixels. As a result, the saturation charge amount might change, or the area efficiency might drop.

In addition, Patent Document 2 discloses a solid-state imaging device in which a photodiode is provided on the upper principal surface side in the Z-axis direction in a semiconductor substrate, and an accumulation diode is provided on the lower principal surface side in the Z-axis direction in the semiconductor substrate. In addition, Patent Document 3 discloses a solid-state imaging device in which a photoelectric conversion film is formed to prevent incident light from entering a readout circuit, an n-type impurity region, or the like.

CITATION LIST

Patent Documents

Patent Document 1: WO 2013/088983 A
Patent Document 2: Japanese Patent Application Laid-Open No. 2012-204524
Patent Document 3: Japanese Patent Application Laid-Open No. 2012-4443

SUMMARY OF THE INVENTION

Problems to be Solved by the Invention

In a case where the structure disclosed in Patent Document 2 or 3 is used in a back-illuminated CMOS image sensor in global shutter mode, it is difficult to completely shield the memory unit from light. To counter this, a buried light blocking film needs to be formed to shield the memory unit formed on the front surface side from light, or a light blocking film needs to be formed on the back surface side. Where such a light blocking film is formed, the thickness of the solid-state imaging device becomes greater. To reduce the size of each solid-state imaging device, there is a demand for shielding memory units from light without any light blocking film.

The present disclosure is made in view of those circumstances, and aims to achieve a smaller size.

Solutions to Problems

A solid-state imaging device as one aspect of the present disclosure includes: a semiconductor substrate having pixels arranged in an array; and a photoelectric conversion film that performs photoelectric conversion of light emitted from a first surface side of the semiconductor substrate. Each of the pixels includes: a charge accumulation layer that accumulates charge generated in the photoelectric conversion film, the charge accumulation layer being formed to be in contact with the photoelectric conversion film on the first surface of the semiconductor substrate; and a transfer path unit that serves as the path to transfer the charge accumulated in the charge accumulation layer, the transfer path unit being formed to extend from the charge accumulation layer to a point near a second surface, the second surface facing the opposite side from the first surface of the semiconductor substrate. The photoelectric conversion film is formed by stacking a layer on the first surface of the semiconductor substrate, the layer being formed with a material having a great light blocking effect.

A manufacturing method as one aspect of the present disclosure is a method of manufacturing a solid-state imaging device that includes: a semiconductor substrate having pixels arranged in an array; and a photoelectric conversion film that performs photoelectric conversion of light emitted from a first surface side of the semiconductor substrate. Each of the pixels includes: a charge accumulation layer that accumulates charge generated in the photoelectric conversion film; and a transfer path unit that serves as the path to transfer the charge accumulated in the charge accumulation layer. The method includes the steps of: forming the charge accumulation layer near the first surface of the semiconductor substrate; forming the transfer path unit extending from the charge accumulation layer to a point near a second surface facing on the opposite side from the first surface of the semiconductor substrate; performing polishing until the charge accumulation layer is exposed through the first surface side of the semiconductor substrate; and forming the photoelectric conversion film by stacking a layer on the first surface of the semiconductor substrate, the layer being formed with a material having a great light blocking effect.

An electronic apparatus as one aspect of the present disclosure includes a solid-state imaging device including: a semiconductor substrate having pixels arranged in an array; and a photoelectric conversion film that performs photoelectric conversion of light emitted from a first surface side of the semiconductor substrate. Each of the pixels includes: a charge accumulation layer that accumulates charge generated in the photoelectric conversion film, the charge accumulation layer being formed to be in contact with the photoelectric conversion film on the first surface of the semiconductor substrate; and a transfer path unit that serves as the path to transfer the charge accumulated in the charge accumulation layer, the transfer path unit being formed to extend from the charge accumulation layer to a point near a second surface, the second surface facing the opposite side from the first surface of the semiconductor substrate. The photoelectric conversion film is formed by stacking a layer on the first surface of the semiconductor substrate, the layer being formed with a material having a great light blocking effect.

In one aspect of the present disclosure, a solid-state imaging device includes a semiconductor substrate having pixels arranged in an array, and a photoelectric conversion film that performs photoelectric conversion of light emitted from a first surface side of the semiconductor substrate. In addition, each of the pixels includes: a charge accumulation layer that accumulates charge generated in the photoelectric conversion film, the charge accumulation layer being formed to be in contact with the photoelectric conversion film on the first surface of the semiconductor substrate; and a transfer path unit that serves as the path to transfer the charge accumulated in the charge accumulation layer, the transfer path unit being formed to extend from the charge accumulation layer to a point near a second surface facing the opposite side from the first surface of the semiconductor substrate. Also, the photoelectric conversion film is formed by stacking a layer formed with a material having a great light blocking effect on the first surface of the semiconductor substrate.

Effects of the Invention

According to one aspect of the present disclosure, a smaller size can be achieved.

MODE FOR CARRYING OUT THE INVENTION

The following is a detailed description of specific embodiments to which the present technology is applied, with reference to the drawings.

Figure 1:
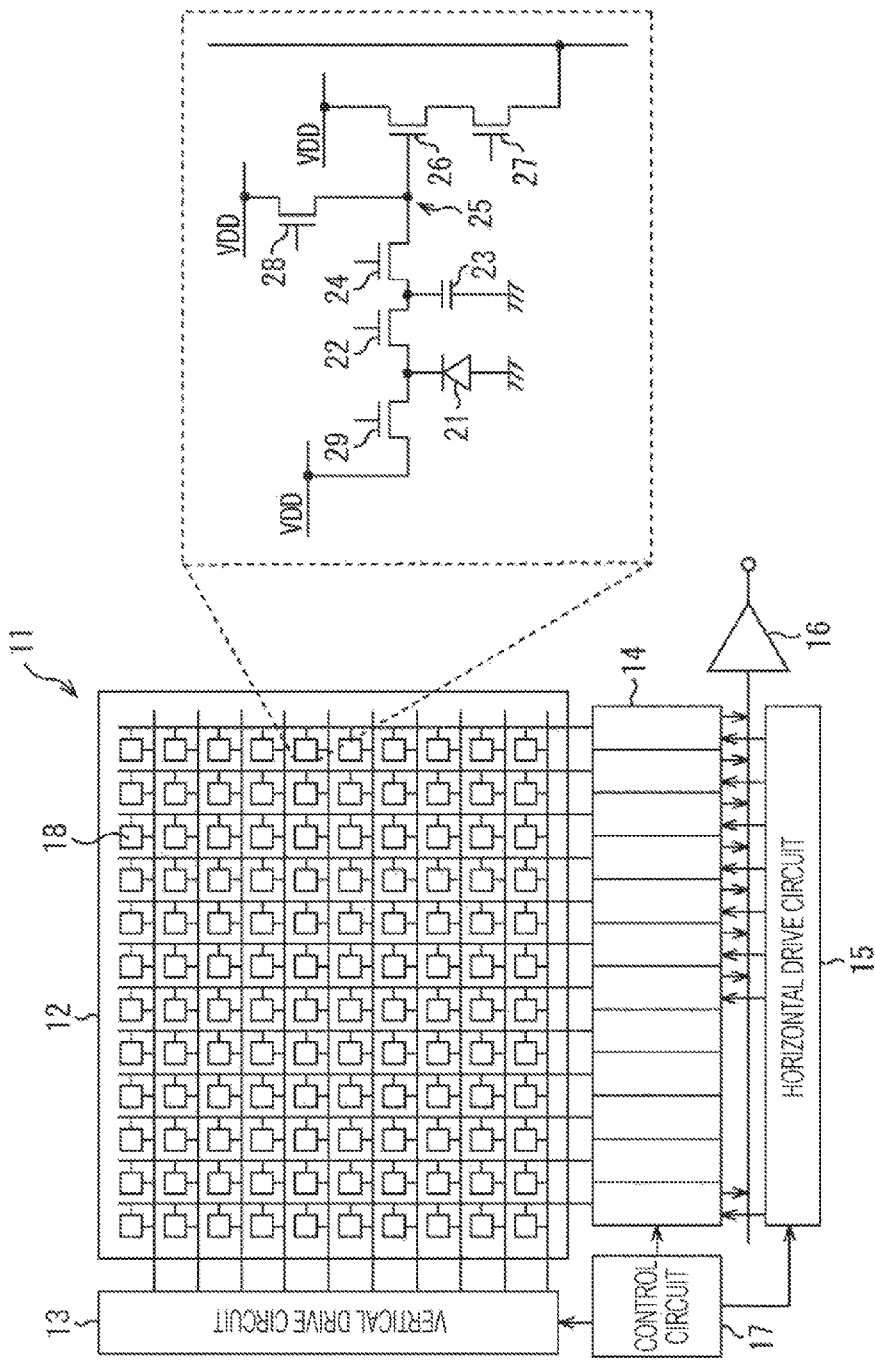
FIG. 1 is a block diagram showing an example structure of an embodiment of a solid-state imaging device to which the present technology is applied.

FIG. 1 is a block diagram showing an example structure of an embodiment of a solid-state imaging device to which the present technology is applied.

In FIG. 1, a solid-state imaging device 11 includes a pixel region 12, a vertical drive circuit 13, a column signal processing circuit 14, a horizontal drive circuit 15, an output circuit 16, and a control circuit 17. In addition, the pixels 18 arranged in the pixel region 12 each includes a PD 21, a memory transfer transistor 22, a memory unit 23, a transfer transistor 24, an FD unit 25, an amplifier transistor 26, a select transistor 27, a reset transistor 28, and a discharge transistor 29.

In the pixel region 12, the pixels 18 are arranged in an array. Each of the pixels 18 is connected to the vertical drive circuit 13 via a horizontal signal line, and is also connected to the column signal processing circuit 14 via a vertical signal line. The pixels 18 each output a pixel signal in accordance with the amount of light emitted via an optical system (not shown), and an image of the object to be formed in the pixel region 12 is formed from these pixel signals.

For each row of the pixels 18 arranged in the pixel region 12, the vertical drive circuit 13 supplies the pixels 18 with drive signals for driving (or for transferring signals to, selecting, resetting, or the like) the respective pixels 18 via the horizontal signal lines. The column signal processing circuit 14 conducts analog-digital conversion on an image signal and removes reset noise by performing correlated double sampling (CDS) on the pixel signals output from the respective pixels 18 via the vertical signal lines.

For each column of the pixels 18 arranged in the pixel region 12, the horizontal drive circuit 15 supplies the column signal processing circuit 14 with a drive signal for causing the column signal processing circuit 14 to output pixel signals therefrom. The output circuit 16 amplifies pixel signals supplied from the column signal processing circuits 14 at the times in accordance with the drive signals from the horizontal drive circuit 15, and outputs the amplified pixel signals to an image processing circuit in a later stage.

The control circuit 17 controls driving of the respective blocks in the solid-state imaging device 11. For example, the control circuit 17 generates clock signals in accordance with the drive cycles of the respective blocks, and supplies the clock signals to the respective blocks.

The PD 21 is a photoelectric conversion unit that converts incident light into charge through photoelectric conversion, and accumulates the charge. The PD 21 has its anode terminal grounded, and has its cathode terminal connected to the memory transfer transistor 22 and the discharge transistor 29.

The memory transfer transistor 22 is driven in accordance with a memory transfer signal supplied from the vertical drive circuit 13. When the memory transfer transistor 22 is switched on, the charge accumulated in the PD 21 is transferred to the memory unit 23. For example, the charge transfer from the PD 21 to the memory unit 23 is performed substantially at the same time in all the pixels 18 in the pixel region 12. That is, charge is transferred simultaneously in all the pixels 18.

The memory unit 23 holds the charge transferred from the PD 21 until the time to output the charge to the column signal processing circuit 14.

The transfer transistor 24 is driven in accordance with a transfer signal supplied from the vertical drive circuit 13. When the transfer transistor 24 is switched on, the charge accumulated in the memory unit 23 is transferred to the FD unit 25. For example, the charge transfer from the memory unit 23 to the FD unit 25 is performed sequentially in each of the columns of the pixels 18 in the pixel region 12.

The FD unit 25 is a floating diffusion region that is connected to the gate electrode of the amplifier transistor 26, and has a predetermined storage capacitance. The FD unit 25 accumulates the charge transferred from the memory unit 23.

The amplifier transistor 26 outputs a pixel signal at the level corresponding to the charge accumulated in the FD unit 25 (or the potential of the FD unit 25), to the vertical signal line via the select transistor 27. That is, as the FD unit 25 is connected to the gate electrode of the amplifier transistor 26, the FD unit 25 and the amplifier transistor 26 function as a conversion unit that converts the charge generated in the PD 21 into a pixel signal at the level corresponding to the charge.

The select transistor 27 is driven by a select signal supplied from the vertical drive circuit 13. When the select transistor 27 is switched on, the pixel signal to be output from the amplifier transistor 26 can be output to the vertical signal line.

The reset transistor 28 is driven by a reset signal supplied from the vertical drive circuit 13. When the reset transistor 28 is switched on, the charge accumulated in the FD unit 25 is discharged to a power supply line VDD, and the FD unit 25 is reset.

The discharge transistor 29 is driven by a discharge signal supplied from the vertical drive circuit 13. When the discharge transistor 29 is switched on, the charge in the PD 21 is discharged to the power supply line VDD. For example, the charge transfer from the PD 21 to the power supply line VDD is performed substantially at the same time in all the pixels 18 in the pixel region 12. That is, charge is discharged simultaneously in all the pixels 18. Also, in a case where a greater charge than the saturation charge amount in the PD 21 is generated through the photoelectric conversion, the discharge transistor 29 also functions as an overflow gate that allows the charge to flow from the PD 21 to the power supply line VDD.

Figure 2:
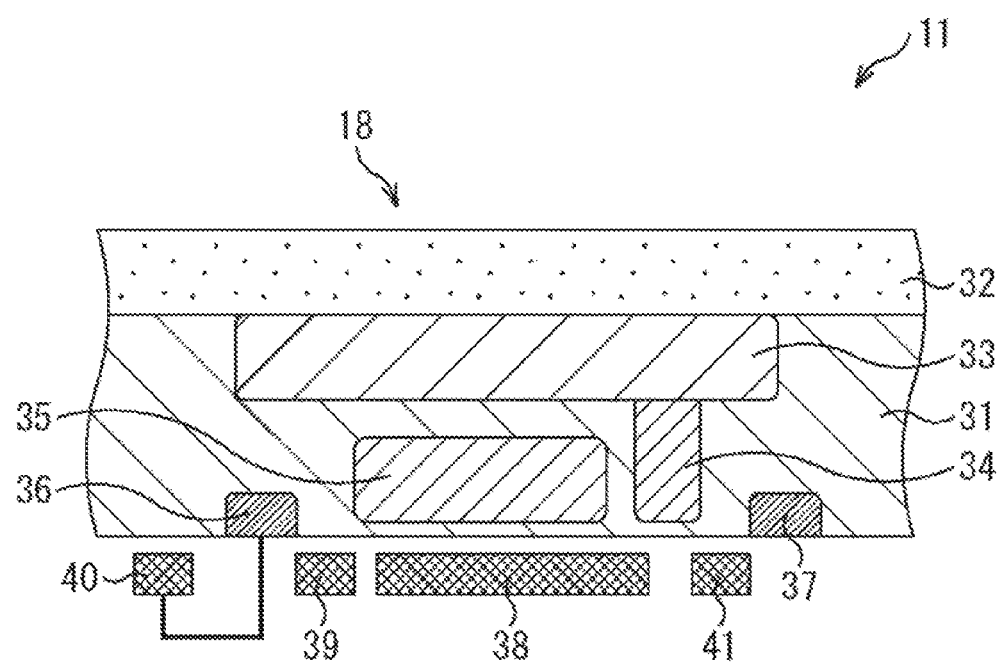
FIG. 2 is a diagram showing a first example structure of a solid-state imaging device.

FIG. 2 is a diagram showing a first example structure of the solid-state imaging device 11.

FIG. 2 shows an example cross-section structure of a portion corresponding to one pixel 18 in the solid-state imaging device 11.

As shown in FIG. 2, in the solid-state imaging device 11, a photoelectric conversion film 32 is stacked on a semiconductor substrate 31. Also, in the semiconductor substrate 31, a charge accumulation layer 33, a transfer path unit 34, a memory unit 35, an FD unit 36, and an overflow drain 37 are formed for each pixel 18. In addition, on the front surface of the semiconductor substrate 31, gate electrodes 38 through 41 are formed for each pixel 18, with an insulating layer (not shown) being interposed in between. Note that, of the solid-state imaging device 11 in this embodiment, the surface on which active elements such as the memory transfer transistor 22 are stacked (the surface facing downward in FIG. 2; a second surface) is referred to as the front surface, and the surface on the opposite side (the surface facing upward in FIG. 2; a first surface) is referred to as the back surface.

The semiconductor substrate 31 is a thin silicon wafer formed by slicing high-purity single-crystal silicon, for example.

The photoelectric conversion film 32 is stacked on the back surface of the semiconductor substrate 31, and is formed with a compound having a greater light blocking effect than that of the silicon forming the semiconductor substrate 31. The photoelectric conversion film 32 performs photoelectric conversion of light emitted from the back surface of the solid-state imaging device 11. Of the photoelectric conversion film 32, the portions existing in the regions corresponding to the respective pixels 18 are equivalent to the PDs 21 (FIG. 1) of the respective pixels 18, and generate charge in accordance with the amounts of light received by the respective pixels 18. In addition, the photoelectric conversion film 32 is formed with a material having a thickness that can prevent light, which is emitted from the back surface side of the solid-state imaging device 11, from reaching the memory unit 35. For example, the material forming the photoelectric conversion film 32 may be a compound lattice-matched to the semiconductor substrate 31, a silicide, an organic material, or the like.

The charge accumulation layer 33 is an n-type region formed to be in contact with the photoelectric conversion film 32 on the back surface of the semiconductor substrate 31, and accumulates charge generated through the photoelectric conversion in the photoelectric conversion film 32.

The transfer path unit 34 is an n-type region formed to extend continuously from the charge accumulation layer 33 toward the front surface side of the semiconductor substrate 31, so that the transfer path unit 34 exists in the vicinity of the front surface of the semiconductor substrate 31. The transfer path unit 34 serves as the path for transferring the charge accumulated in the charge accumulation layer 33 to the memory unit 35. To assist the charge transfer, the transfer path unit 34 has a potential gradient so that the potential becomes deeper toward the front surface of the semiconductor substrate 31.

The memory unit 35 is an n-type region that is formed in the vicinity of the front surface side of the semiconductor substrate 31 and extends from the transfer path unit 34 via the memory transfer transistor 22 (FIG. 1). The memory unit 35 is equivalent to the memory unit 23 in FIG. 1, and accumulates the charge transferred from the charge accumulation layer 33 via the transfer path unit 34. In addition, the potential of the memory unit 35 is deeper than that of the charge accumulation layer 33, and the saturation charge amount in the memory unit 35 is equal to the saturation charge amount in the charge accumulation layer 33 or is larger than the saturation charge amount in the charge accumulation layer 33. With this design, the memory unit 35 can hold all the charge accumulated in the charge accumulation layer 33.

The FD unit 36 is a high-impurity n-type region (a floating diffusion region) that is formed to be in contact with the front surface of the semiconductor substrate 31. The FD unit 36 is equivalent to the FD unit 25 in FIG. 1, and temporarily holds the charge transferred from the memory unit 35.

The overflow drain 37 is a high-impurity n-type region that is formed to be in contact with the front surface of the semiconductor substrate 31, and extends from the transfer path unit 34 via the discharge transistor 29 (FIG. 1). The overflow drain 37 is connected to a power supply voltage VDD (not shown). In addition, the overflow drain 37 is disposed on a different side (on the opposite side in the example shown in FIG. 2) of the transfer path unit 34 from the side on which the memory unit 35 is formed.

The gate electrode 38 is stacked on the front surface of the semiconductor substrate 31 so as to cover almost the entire surface of the memory unit 35, including the region between the transfer path unit 34 and the memory unit 35. The gate electrode 38 forms the memory transfer transistor 22 in FIG. 1. When a predetermined voltage is applied to the gate electrode 38, the potential of the region between the transfer path unit 34 and the memory unit 35, and of the memory unit 35 becomes lower, and the charge accumulated in the charge accumulation layer 33 is transferred to the memory unit 35 via the transfer path unit 34.

The gate electrode 39 is stacked on the front surface of the semiconductor substrate 31 so as to cover the region between the memory unit 35 and the FD unit 36. The gate electrode 39 forms the transfer transistor 24 in FIG. 1. When a predetermined voltage is applied to the gate electrode 39, the potential of the region between the memory unit 35 and the FD unit 36 becomes lower, and the charge accumulated in the memory unit 35 is transferred to the FD unit 36.

The gate electrode 40 forms the amplifier transistor 26 in FIG. 1. As the charge is accumulated in the FD unit 36, the potential corresponding to the charge is applied to the gate electrode 40, so that the potential is converted into a pixel signal at the level corresponding to the charge generated in the photoelectric conversion film 32.

The gate electrode 41 is stacked on the front surface of the semiconductor substrate 31 so as to cover the region between the transfer path unit 34 and the overflow drain 37. The gate electrode 41 forms the discharge transistor 29 in FIG. 1. When a predetermined voltage is applied to the gate electrode 41, the potential of the region between the transfer path unit 34 and the overflow drain 37 becomes lower. As a result, the charge accumulated in the charge accumulation layer 33 is discharged to the power supply voltage VDD (see FIG. 1) via the overflow drain 37. For example, the vertical drive circuit 13 in FIG. 1 drives the discharge transistors 29 substantially at the same time in the pixels 18 disposed in the pixel region 12, and causes the discharge transistors 29 to simultaneously discharge the charge accumulated in the charge accumulation layers 33 to the overflow drains 37. Also, as will be described later with reference to FIG. 5, when a greater charge than the saturation charge amount in the PD 21 is generated through photoelectric conversion, the charge overflows from the transfer path unit 34 to the overflow drain 37.

As described above, in the solid-state imaging device 11, the photoelectric conversion film 32 formed with a compound having a greater light blocking effect than that of the silicon forming the semiconductor substrate 31 is stacked on the back surface side of the semiconductor substrate 31. Consequently, the need to form a light blocking film to shield the memory unit 35 from light in the solid-state imaging device 11 is eliminated, and the solid-state imaging device 11 can be made smaller in thickness and size.

Also, the solid-state imaging device 11 is designed not to use a vertical transistor in transferring charge from the charge accumulation layer 33 to the memory unit 35, but to use the transfer path unit 34 extending from the charge accumulation layer 33 to a point near the front surface of the solid-state imaging device 11. In this aspect, the transfer path unit 34 is designed to have such a potential gradient so that the potential becomes deeper toward the front surface of the semiconductor substrate 31. Thus, the charge transfer can be performed with a higher degree of certainty.

Further, in the solid-state imaging device 11, the memory transfer transistor 22 and the discharge transistor 29 are arranged with respect to the transfer path unit 34. With this, even though only one transfer path unit 34 is provided to extract the charge from the charge accumulation layer 33, the charge transfer from the charge accumulation layer 33 to the memory unit 35 can be performed substantially at the same time in all the pixels 18, and the charge can be discharged from the charge accumulation layer 33 to the overflow drain 37 in the solid-state imaging device 11.

Thus, the solid-state imaging device 11 can take images without a decrease in frame rate.

For example, in a case where a global shutter mode is realized with vertical transistors as in the above described structure disclosed in Patent Document 1, charge accumulation units are reset via FD units and memory units. Normally, after the charge is collectively transferred to the memory units, the next exposure is disclosed. In such a structure, after the sequential readout is finished, the charge accumulation units are collectively reset, and exposure is performed. As a result, the frame rate becomes lower. Therefore, to avoid a decrease in the frame rate, vertical transistors for resetting the charge accumulation units become necessary, and the area efficiency becomes lower in such a structure.

Also, in a structure using vertical transistors, paths (overflow paths) for causing the charge in the charge accumulation units to overflow need to be formed separately from the vertical transistors. For example, in a structure in which overflow paths are formed in the power supply lines formed on the front surface side, the saturation charge amount might change due to variation. In a structure in which overflow paths are formed in other adjacent pixels, the area efficiency becomes lower.

In the solid-state imaging device 11, on the other hand, the transfer path unit 34 is used so that the charge transfer from the charge accumulation layer 33 to the memory unit 35 can be performed substantially at the same time in all the pixels 18, and the charge discharge from the charge accumulation layer 33 into the overflow drain 37 can be performed substantially at the same time in all the pixels 18. Thus, a decrease in the frame rate can be avoided. Further, in the solid-state imaging device 11, the charge can overflow from the transfer path unit 34 to the overflow drain 37. Thus, the above described change in the saturation charge amount and a decrease in the area efficiency can be avoided.

Figure 3:
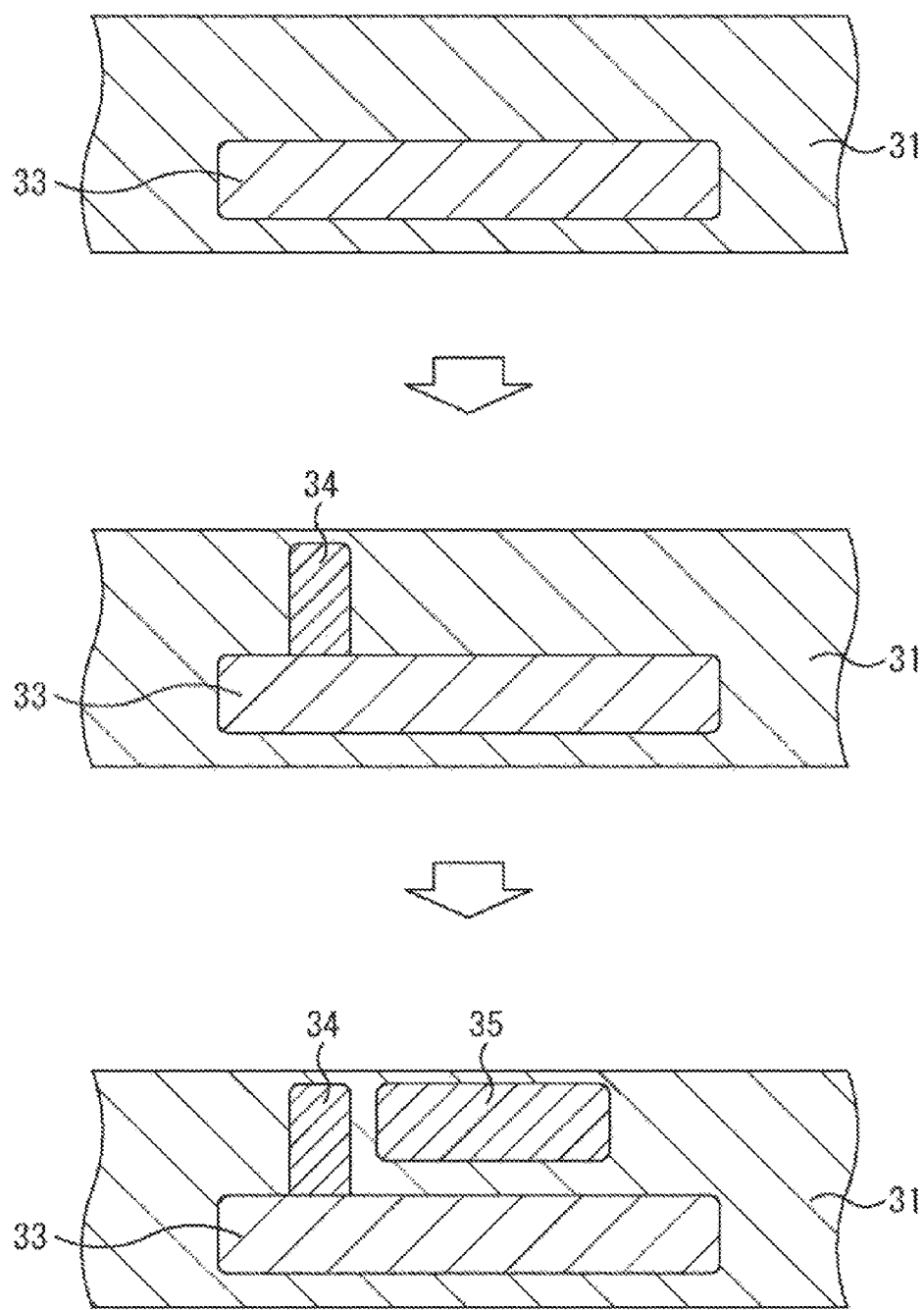
FIG. 3 is a diagram for explaining a method of manufacturing the solid-state imaging device.
Figure 4:
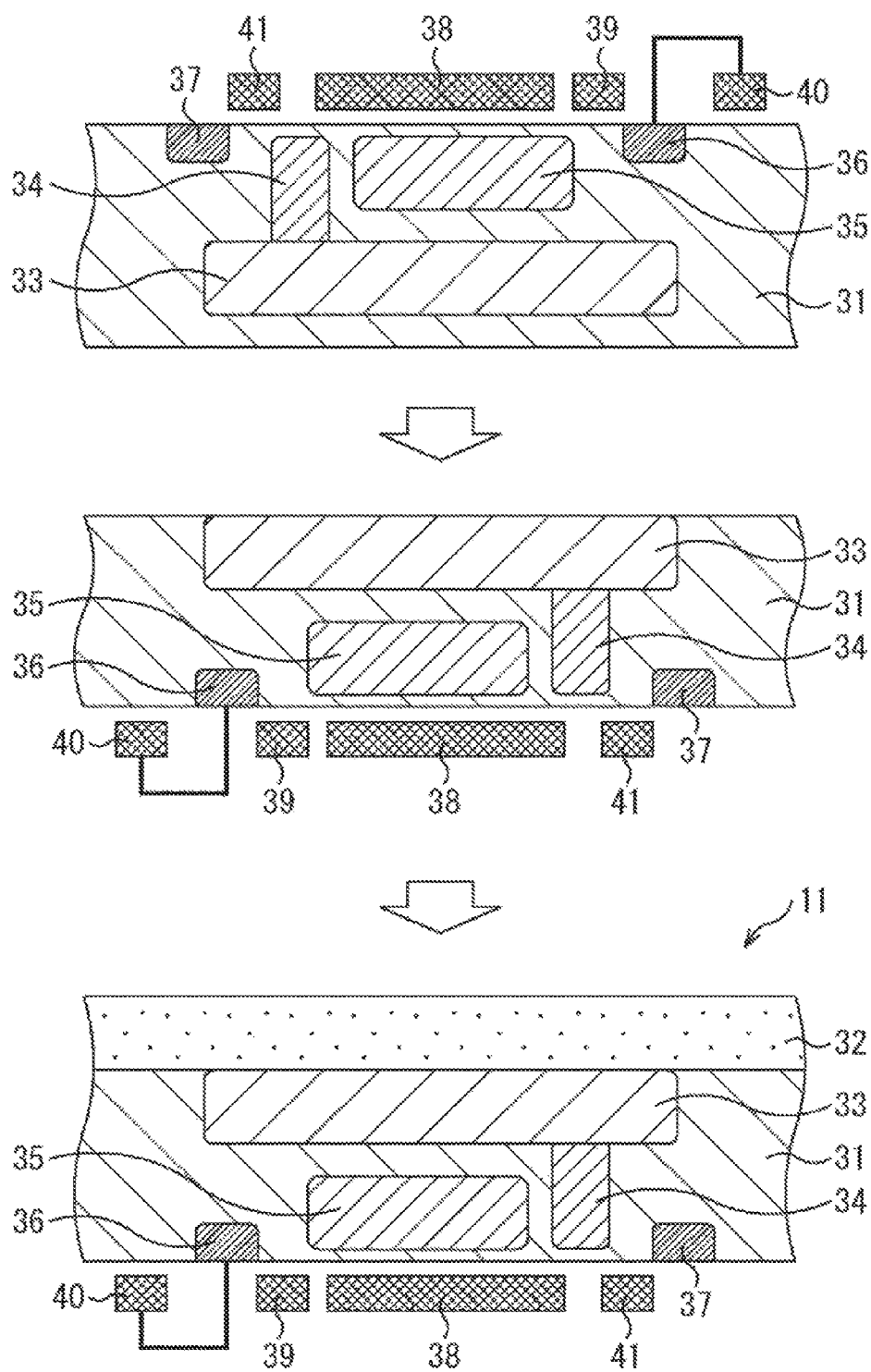
FIG. 4 is a diagram for explaining a method of manufacturing the solid-state imaging device.

Referring now to FIGS. 3 and 4, a method of manufacturing the solid-state imaging device 11 is described. Note that, in FIG. 3, the front surface side of the semiconductor substrate 31 faces upward, and the back surface side of the semiconductor substrate 31 on which the photoelectric conversion film 32 is to be stacked faces downward.

First, in step 1, n-type impurity ions are implanted into the semiconductor substrate 31, so that the charge accumulation layer 33 is formed in the vicinity of the back surface of the semiconductor substrate 31 or on the side on which the photoelectric conversion film 32 is to be stacked, as shown in the top portion of FIG. 3.

Next, in step 2, n-type impurity ions are implanted into the semiconductor substrate 31, so that the transfer path unit 34 extending from the charge accumulation layer 33 toward the front surface of the semiconductor substrate 31 is formed, as shown in the middle portion of FIG. 3. At this point of time, the dose amount is adjusted, so that the potential becomes deeper toward the front surface side of the semiconductor substrate 31. In addition, the transfer path unit 34 is designed to have as small an area as possible when the semiconductor substrate 31 is seen in a plan view. That is, as various transistors and the like to be formed on the front surface of the semiconductor substrate 31 are formed on the front surface side of the semiconductor substrate 31, the area efficiency can be increased by reducing the area of the transfer path unit 34.

Next, in step 3, n-type impurity ions are implanted into the semiconductor substrate 31, so that the memory unit 35 is formed, as shown in the bottom portion of FIG. 3. Note that, although the memory unit 35 is designed to have a smaller area than the charge accumulation layer 33, the memory unit 35 is designed to have a deeper potential than that of the charge accumulation layer 33, so that the saturation charge amount in the memory unit 35 can be made equal to or larger than the saturation charge amount in the charge accumulation layer 33.

Next, in step 4, n-type impurity ions are implanted into the semiconductor substrate 31, so that the FD unit 36 and the overflow drain 37 are formed, as shown in the top portion of FIG. 4. Further, the gate electrodes 38 through 41 are formed on the front surface of the semiconductor substrate 31, with an insulating film (not shown) being interposed in between. A wiring line to connect the FD unit 36 and the gate electrode 40 is then formed.

Next, in step 5, the semiconductor substrate 31 is reversed, and polishing is performed on the back surface side of the semiconductor substrate 31 to make the semiconductor substrate 31 thinner by chemical mechanical polishing (CMP), until the charge accumulation layer 33 is exposed, as shown in the middle portion of FIG. 4.

Also, in step 6, a film made of a material having a great light blocking effect is formed on the back surface of the solid-state imaging device 11, so that the photoelectric conversion film 32 is formed, as shown in the bottom portion of FIG. 4. Examples of materials that can be used for forming the photoelectric conversion film 32 include GaAs/InP, CuInGaS/CuInGaSe/AgInGaSe2, FeS2/Cu2S/SnS2/BaSi2, GaP, and InGaP. Alternatively, a silicide-based material or an organic material may be used as the material for forming the photoelectric conversion film 32. Also, the photoelectric conversion film 32 is lattice-matched to the silicon forming the semiconductor substrate 31, so that white scratches in the interface with the semiconductor substrate 31 can be prevented. Such a material is preferably CuInGaS, for example.

Through the above described steps, the solid-state imaging device 11 can be manufactured.

Figure 5:
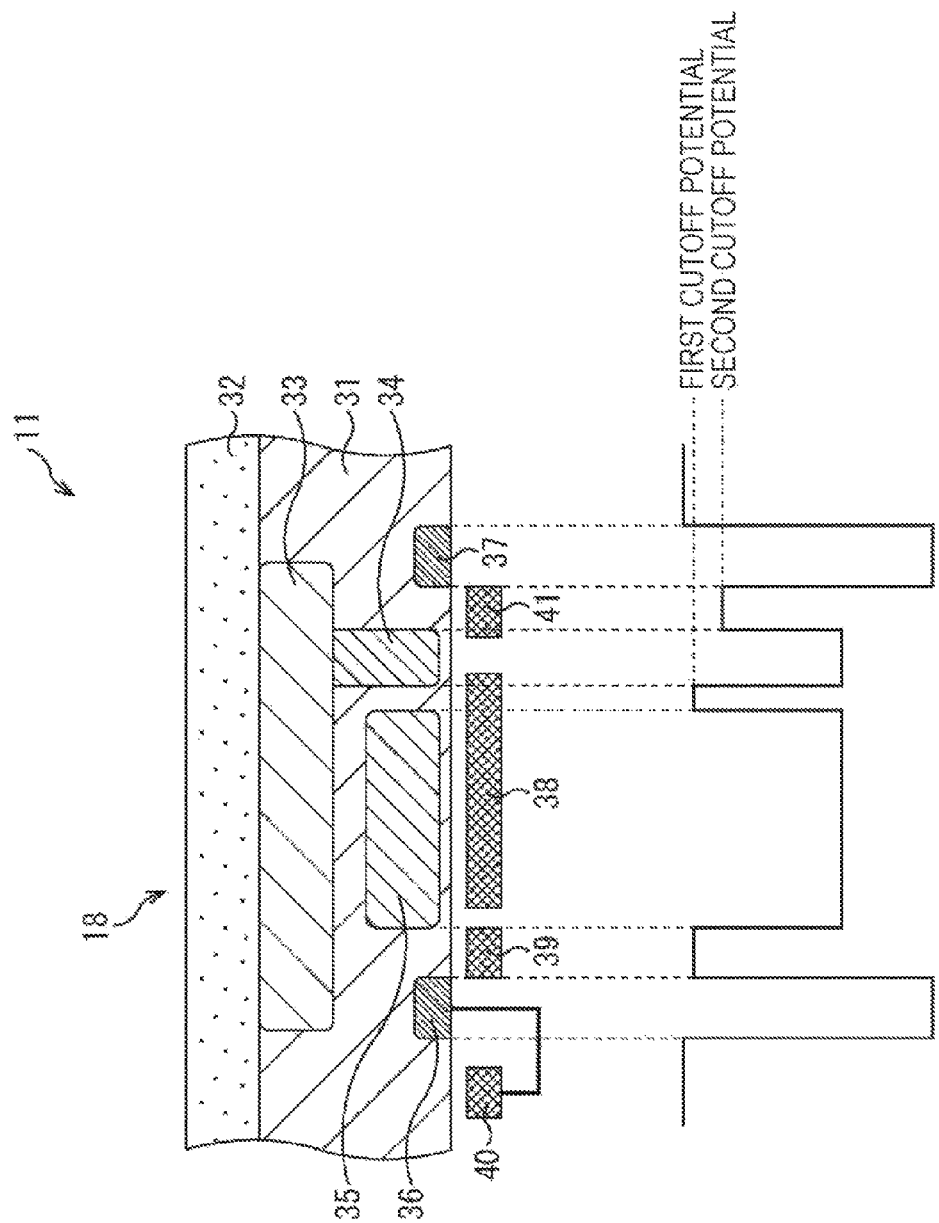
FIG. 5 is a diagram for explaining the potential of a semiconductor substrate.

Referring now to FIG. 5, the potential in the semiconductor substrate 31 of the solid-state imaging device 11 is described.

In FIG. 5, the potential in the plane that extends through the transfer path unit 34, the memory unit 35, the FD unit 36, and the overflow drain 37 is shown below the solid-state imaging device 11.

As shown in FIG. 5, a second cutoff potential of the discharge transistor 29 between the transfer path unit 34 and the overflow drain 37 becomes lower or the potential becomes deeper than a first cutoff potential of the memory transfer transistor 22 between the transfer path unit 34 and the memory unit 35. With this, when the charge accumulation layer 33 is saturated, the solid-state imaging device 11 can restrict the charge flowing direction to the direction from the transfer path unit 34 toward the overflow drain 37.

For example, in a case where the charge overflows from the charge accumulation layer 33 to the memory unit 35 while the memory unit 35 holds the charge, the amount of the charge stored in the memory unit 35 changes, and therefore, image quality might be adversely affected. In the solid-state imaging device 11, on the other hand, the charge overflows into the overflow drain 37. Thus, adverse influence on image quality can be eliminated.

Figure 6:
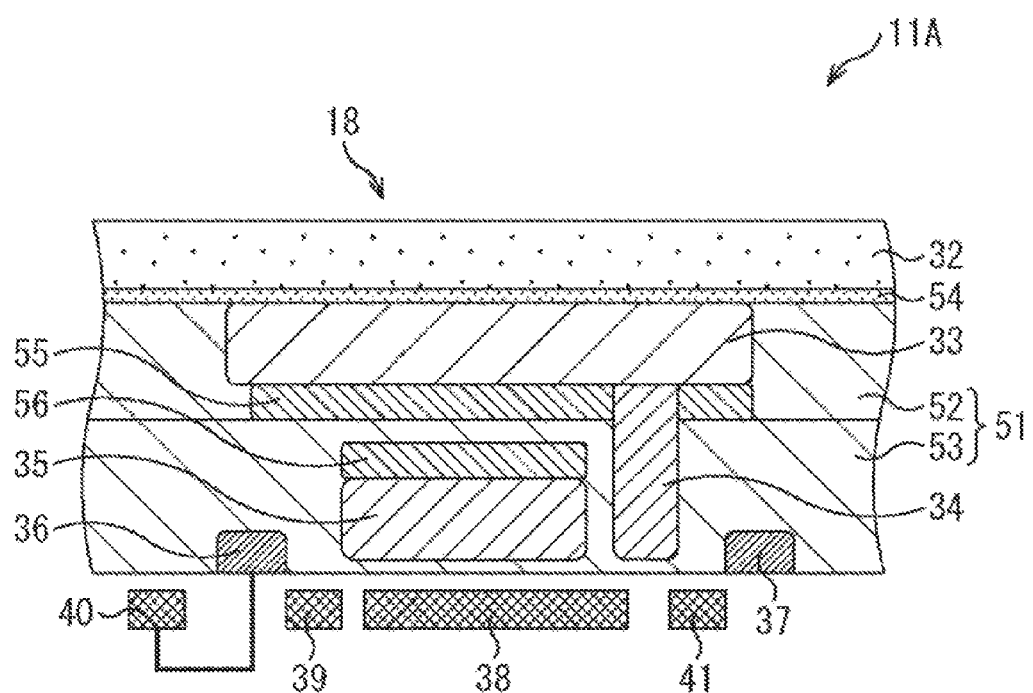
FIG. 6 is a diagram showing a second example structure of a solid-state imaging device.

FIG. 6 is a diagram showing a second example structure of the solid-state imaging device 11.

Like FIG. 2, FIG. 6 shows an example cross-section structure of the portion corresponding to one pixel 18 of a solid-state imaging device 11A. In FIG. 6, the same components as those of the solid-state imaging device 11 in FIG. 2 are denoted by the same reference numerals as those in FIG. 2, and detailed explanation thereof will not be made below.

As shown in FIG. 6, in the solid-state imaging device 11A, a semiconductor substrate 51 is formed with a silicon substrate 52 and an epitaxial layer 53, and a photoelectric conversion film 32 is stacked on the back surface of the silicon substrate 51 via a buffer layer 54. Further, the solid-state imaging device 11A differs from the solid-state imaging device 11 in FIG. 2 in that a pinning layer 55 to be in contact with the charge accumulation layer 33 is formed in the silicon substrate 52, and a p-type region 56 to be in contact with the memory unit 35 is formed in the epitaxial layer 53.

In the semiconductor substrate 51, silicon is epitaxially grown on the front surface of the silicon substrate 52, to form the epitaxial layer 53. For example, the epitaxial layer 53 is formed on the silicon substrate 52 having the charge accumulation layer 33 and the pinning layer 55 formed therein, and the memory unit 35 and the p-type region 56 are formed in the epitaxial layer 53, so that a steep p-type profile can be formed between the p-type region 56 and the memory unit 35. With this, the saturation charge amount in the memory unit 35 can be increased. The p-type region 56 is a high-impurity region formed to be in contact with the back surface side of the memory unit 35.

As the buffer layer 54 is formed between the photoelectric conversion film 32 and the semiconductor substrate 51, impurity diffusion from the photoelectric conversion film 32 into the semiconductor substrate 51 can be reduced or prevented. Consequently, a decrease in the saturation charge amount in the charge accumulation layers 33 can be reduced or prevented.

The pinning layer 55 is a high-impurity p-type region formed to be in contact with the front surface of the semiconductor substrate 51, for example. The p-type pinning layer 55 and the n-type charge accumulation layer 33 can form a so-called hole accumulation diode (HAD) structure. With this, the sensitivity of the solid-state imaging device 11A can be increased, and noise can be lowered.

Figure 7:
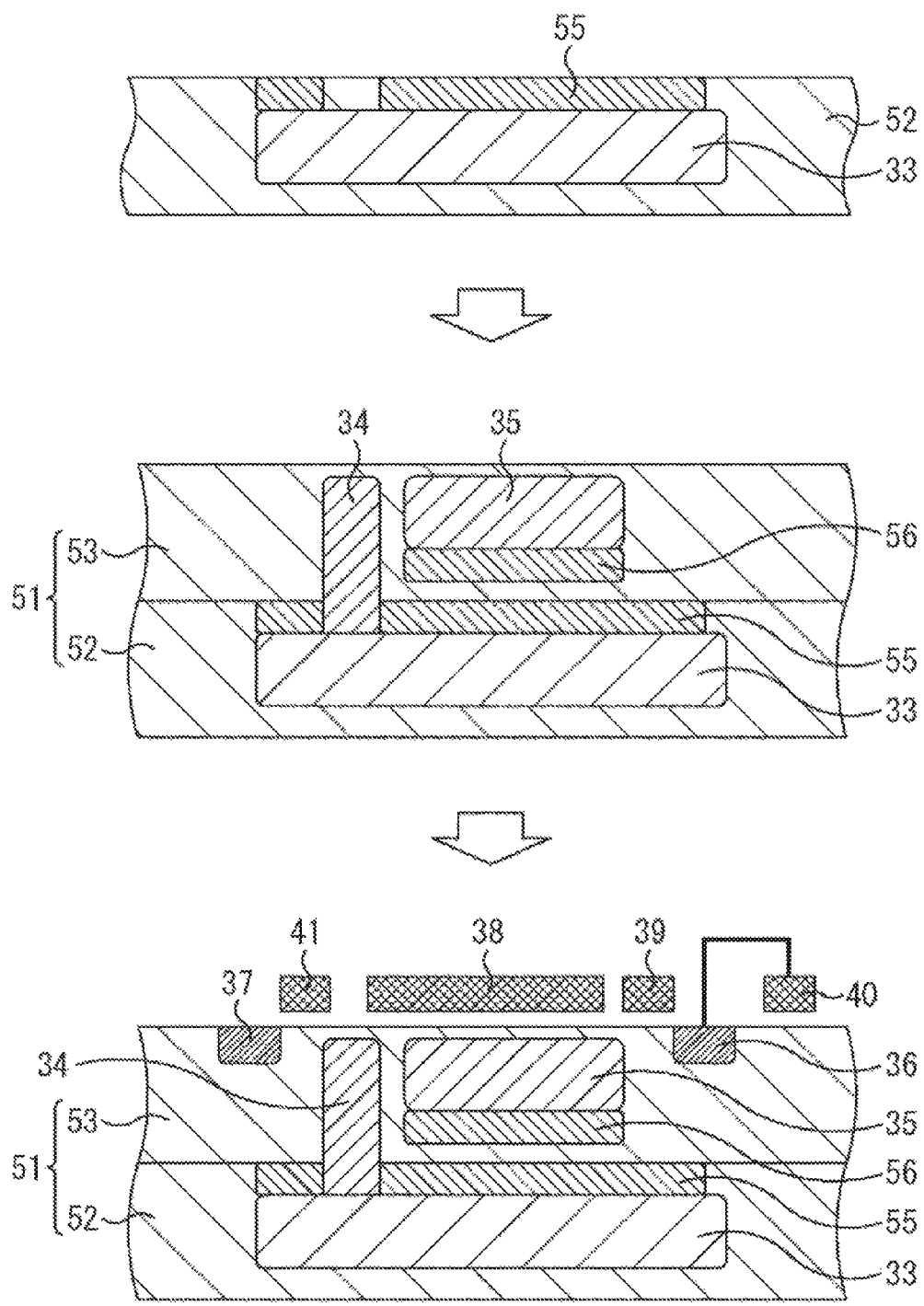
FIG. 7 is a diagram for explaining a method of manufacturing the solid-state imaging device.

Referring now to FIG. 7, a method of manufacturing the solid-state imaging device 11A is described. Note that, in FIG. 7, the front surface side of the semiconductor substrate 51 faces upward, and the back surface side of the semiconductor substrate 51 on which the photoelectric conversion film 32 is to be stacked faces downward.

First, in step 11, n-type impurity ions are implanted into the silicon substrate 52, so that the charge accumulation layer 33 is formed in the vicinity of the back surface of the silicon substrate 52 or on the side on which the photoelectric conversion film 32 is to be stacked, as shown in the top portion of FIG. 7. Further, p-type impurity ions are implanted into the silicon substrate 52, so that the pinning layer 55 to be in contact with the front surface of the silicon substrate 52 is formed.

Next, in step 12, silicon is epitaxially grown on the front surface of the silicon substrate 52, to form the epitaxial layer 53. Thus, the semiconductor substrate 51 is formed, as shown in the middle portion of FIG. 7. Further, p-type impurity ions are implanted into the memory unit 35, to form the p-type region 56. N-type impurity ions are then implanted into the semiconductor substrate 51, to form the transfer path unit 34 extending from the charge accumulation layer 33 toward the front surface of the semiconductor substrate 51, and to form the memory unit 35 in the epitaxial layer 53.

Next, in step 13, n-type impurity ions are implanted into the semiconductor substrate 51, so that the FD unit 36 and the overflow drain 37 are formed, as shown in the bottom portion of FIG. 7. Further, the gate electrodes 38 through 41 are formed on the front surface of the semiconductor substrate 51, with an insulating film (not shown) being interposed in between. A wiring line to connect the FD unit 36 and the gate electrode 40 is then formed.

After that, the semiconductor substrate 51 is reversed, and polishing is performed on the back surface side of the semiconductor substrate 51 to make the semiconductor substrate 51 thinner by chemical mechanical polishing (CMP), until the charge accumulation layer 33 is exposed, as shown in step 5 in FIG. 4. Then, the buffer layer 54 is then stacked on the back surface of the semiconductor substrate 51, and the photoelectric conversion film 32 is further formed.

In this manner, the solid-state imaging device 11A shown in FIG. 6 can be manufactured.

Figure 8:
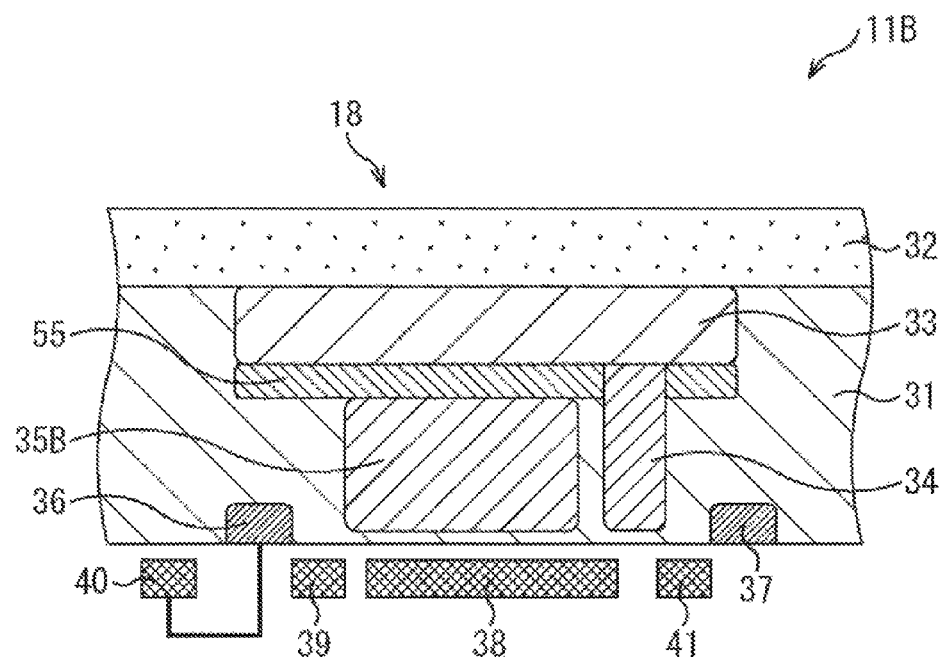
FIG. 8 is a diagram showing a third example structure of a solid-state imaging device.

FIG. 8 is a diagram showing a third example structure of the solid-state imaging device 11.

Like FIG. 2, FIG. 8 shows an example cross-section structure of the portion corresponding to one pixel 18 of a solid-state imaging device 11B. In FIG. 8, the same components as those of the solid-state imaging device 11 in FIG. 2 are denoted by the same reference numerals as those in FIG. 2, and detailed explanation thereof will not be made below.

As shown in FIG. 8, the solid-state imaging device 11B differs from the solid-state imaging device 11 in FIG. 2 in that a pinning layer 55 to be in contact with the front surface side of the charge accumulation layer 33 is formed, and a memory unit 35B extending from a point in the vicinity of the semiconductor substrate 31 to a point in contact with the pinning layer 55 is formed. Here, the pinning layer 55 is a region having a high p-type impurity concentration, as in the solid-state imaging device 11A in FIG. 6.

In the solid-state imaging device 11B having such a structure, the memory unit 35B extends to a point in contact with the pinning layer 55, so that the volume of the memory unit 35B can be made larger than that in the solid-state imaging device 11 in FIG. 2. With this structure, a capacitance in a sidewall of the memory unit 35B can be secured, and the saturation charge amount Qs in the memory unit 35B can be increased. Note that, in a conventional solid-state imaging device, an increase in the volume of a memory unit results in smear. In the solid-state imaging device 11B, however, light can be blocked by the photoelectric conversion film 32, and accordingly, the volume of the memory unit 35B can be increased without any generation of smear.

Figure 9:
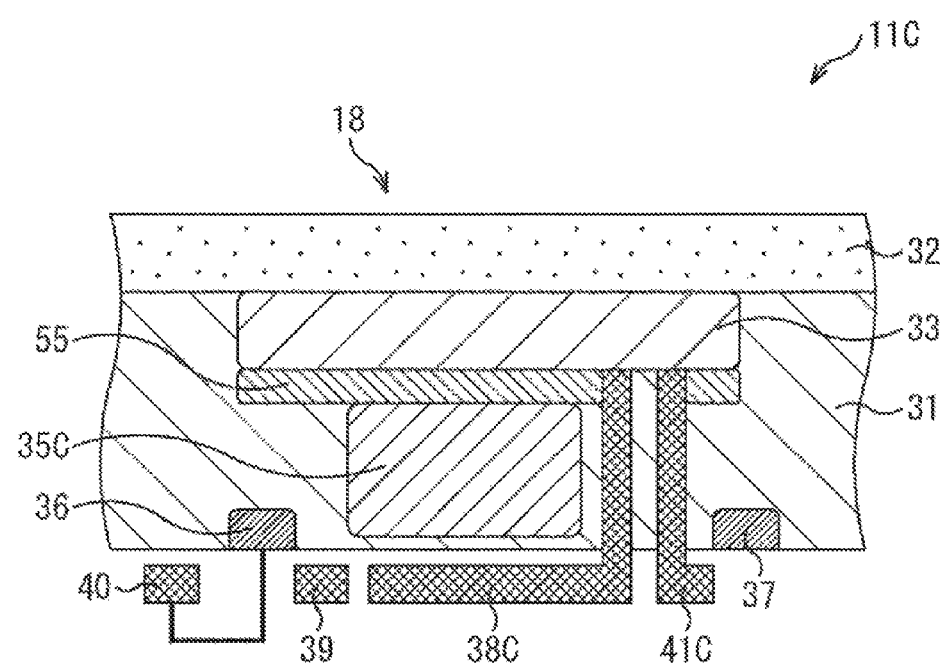
FIG. 9 is a diagram showing a fourth example structure of a solid-state imaging device.

FIG. 9 is a diagram showing a fourth example structure of the solid-state imaging device 11.

Like FIG. 8, FIG. 9 shows an example cross-section structure of the portion corresponding to one pixel 18 of a solid-state imaging device 11C. In FIG. 9, the same components as those of the solid-state imaging device 11B in FIG. 8 are denoted by the same reference numerals as those in FIG. 8, and detailed explanation thereof will not be made below.

As shown in FIG. 9, the solid-state imaging device 11C is the same as the solid-state imaging device 11B in FIG. 8 in that a memory unit 35C extends to a point in contact with the pinning layer 55. However, the solid-state imaging device 11C differs from the solid-state imaging device 11B in FIG. 8 in that the transfer path unit 34 is replaced with vertical gate electrodes 38C and 41C.

Specifically, in the solid-state imaging device 11C, the vertical gate electrodes 38C and 41C are formed deep inside the semiconductor substrate 31, and extend from the front surface of the semiconductor substrate 31 to the charge accumulation layer 33. The vertical gate electrodes 38C and 41C are so-called vertical transistor structures. With such vertical transistor structures, the charge transfer from the charge accumulation layer 33 to the memory unit 35C, and the charge discharge from the charge accumulation layer 33 into the overflow drain 37 can be performed without the transfer path unit 34.

Figure 10:
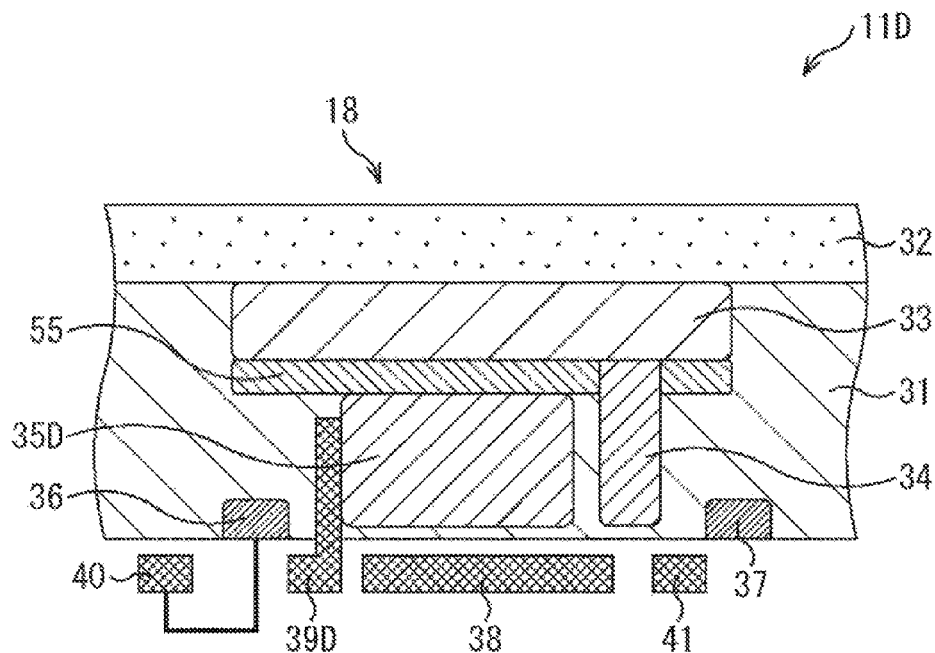
FIG. 10 is a diagram showing a fifth example structure of a solid-state imaging device.

FIG. 10 is a diagram showing a fifth example structure of the solid-state imaging device 11.

Like FIG. 8, FIG. 10 shows an example cross-section structure of the portion corresponding to one pixel 18 of a solid-state imaging device 11D. In FIG. 10, the same components as those of the solid-state imaging device 11B in FIG. 8 are denoted by the same reference numerals as those in FIG. 8, and detailed explanation thereof will not be made below.

As shown in FIG. 10, the solid-state imaging device 11D is the same as the solid-state imaging device 11B in FIG. 8 in that a memory unit 35D extends to a point in contact with the pinning layer 55. However, the solid-state imaging device 11C differs from the solid-state imaging device 11B in FIG. 8 in that a gate electrode 39D is a vertical transistor structure.

Specifically, in the solid-state imaging device 11D, the gate electrode 39D is formed from the front surface of the semiconductor substrate 31 toward the inside of the semiconductor substrate 31, and is in contact with a side surface of the memory unit 35D. The charge to be transferred to the FD unit 36 can be read from the memory unit 35D via the extending portion. With this structure, the charge can be transferred to the FD unit 36 without fail, even if the potential of the memory unit 35D is made deeper. Thus, in the solid-state imaging device 11D, the potential of the memory unit 35D can be made deeper, and the saturation charge amount Qs in the memory unit 35D can be increased.

Figure 11:
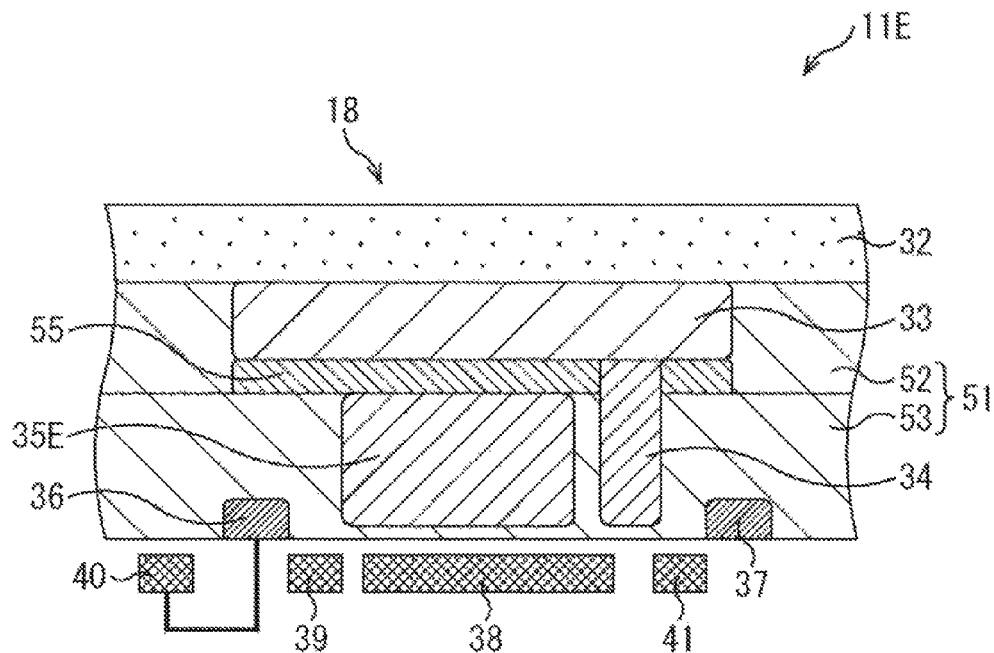
FIG. 11 is a diagram showing a sixth example structure of a solid-state imaging device.

FIG. 11 is a diagram showing a sixth example structure of the solid-state imaging device 11.

Like FIG. 8, FIG. 11 shows an example cross-section structure of the portion corresponding to one pixel 18 of a solid-state imaging device 11E. In FIG. 11, the same components as those of the solid-state imaging device 11B in FIG. 8 are denoted by the same reference numerals as those in FIG. 8, and detailed explanation thereof will not be made below.

As shown in FIG. 11, the solid-state imaging device 11E is the same as the solid-state imaging device 11B in FIG. 8 in that a memory unit 35E extends to a point in contact with the pinning layer 55. However, the solid-state imaging device 11E differs from the solid-state imaging device 11B in FIG. 8 in that a semiconductor substrate 51 is formed with a silicon substrate 52 and an epitaxial layer 53 as in the solid-state imaging device 11A shown in FIG. 6.

Specifically, in the solid-state imaging device 11E, the epitaxial layer 53 is formed on the silicon substrate 52 having the charge accumulation layer 33 and the pinning layer 55 formed therein, and the memory unit 35E to be in contact with the pinning layer 55 is formed in the epitaxial layer 53, so that a sharp p-type profile can be formed between the pinning layer 55 and the memory unit 35E. Thus, the capacitance in the bottom surface of the memory unit 35E can be reinforced, and the saturation charge amount Qs in the memory unit 35E can be increased.

Figure 12:
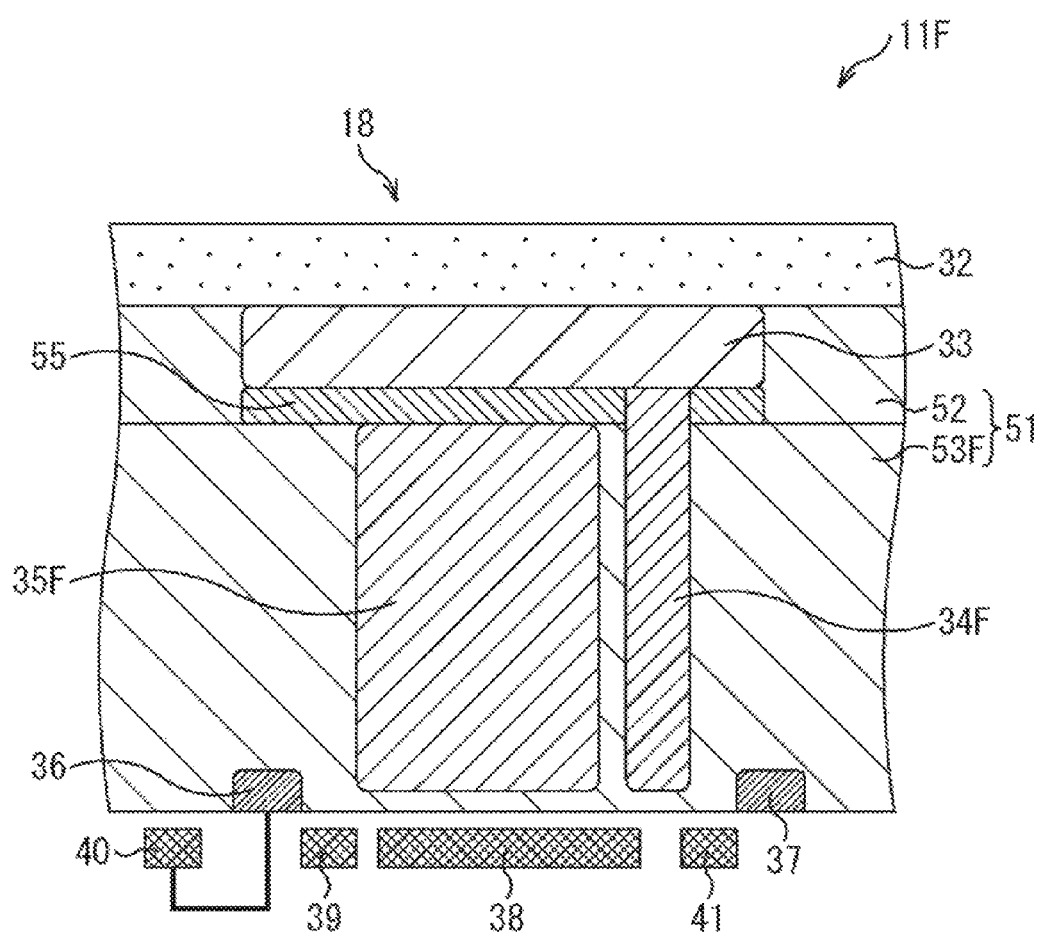
FIG. 12 is a diagram showing a seventh example structure of a solid-state imaging device.

FIG. 12 is a diagram showing a seventh example structure of the solid-state imaging device 11.

Like FIG. 8, FIG. 12 shows an example cross-section structure of the portion corresponding to one pixel 18 of a solid-state imaging device 11F. In FIG. 12, the same components as those of the solid-state imaging device 11B in FIG. 8 are denoted by the same reference numerals as those in FIG. 8, and detailed explanation thereof will not be made below.

As shown in FIG. 12, the solid-state imaging device 11F is the same as the solid-state imaging device 11B in FIG. 8 in that a memory unit 35F extends to a point in contact with the pinning layer 55. However, the solid-state imaging device 11F differs from the solid-state imaging device 11B in FIG. 8 in that a semiconductor substrate 51 is formed with a silicon substrate 52 and an epitaxial layer 53 as in the solid-state imaging device 11E shown in FIG. 11, and the epitaxial layer 53 is made thicker.

In the solid-state imaging device 11F having such a structure, a sharp p-type profile is formed between the pinning layer 55 and the memory unit 35F, so that the saturation charge amount Qs in the memory unit 35F can be increased, as in the solid-state imaging device 11E in FIG. 11. In addition to that, the extending portion of the memory unit 35F is elongated by the increase in the thickness of the epitaxial layer 53, so that the saturation charge amount Qs can be increased.

Figure 13:
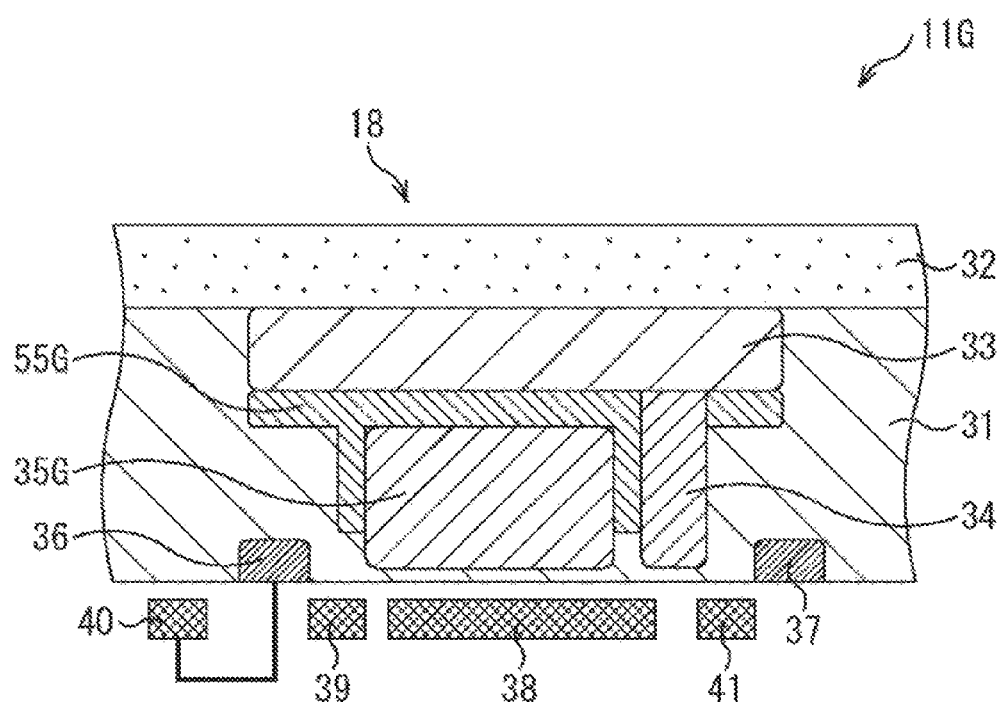
FIG. 13 is a diagram showing an eighth example structure of a solid-state imaging device.

FIG. 13 is a diagram showing an eighth example structure of the solid-state imaging device 11.

Like FIG. 8, FIG. 13 shows an example cross-section structure of the portion corresponding to one pixel 18 of a solid-state imaging device 11G. In FIG. 13, the same components as those of the solid-state imaging device 11B in FIG. 8 are denoted by the same reference numerals as those in FIG. 8, and detailed explanation thereof will not be made below.

As shown in FIG. 13, the solid-state imaging device 11G is the same as the solid-state imaging device 11B in FIG. 8 in that a memory unit 35G extends to a point in contact with a pinning layer 55G. However, the solid-state imaging device 11G differs from the solid-state imaging device 11B in FIG. 8 in that part of the pinning layer 55G is formed to extend toward the front surface side of the semiconductor substrate 31, to cover the side surfaces of the memory unit 35G.

In the solid-state imaging device 11G having such a structure, part of the high-impurity p-type pinning layer 55G is formed to extend along the sidewalls of the memory unit 35G, so that the capacitance in the sidewalls of the memory unit 35G can be reinforced, and the saturation charge amount Qs in the memory unit 35G can be increased. Further, part of the pinning layer 55G is formed to separate the memory unit 35G and the transfer path unit 34 from each other. Thus, the pinning layer 55G can function as a separating unit to separate the memory unit 35G and the transfer path unit 34 from each other.

Figure 14:
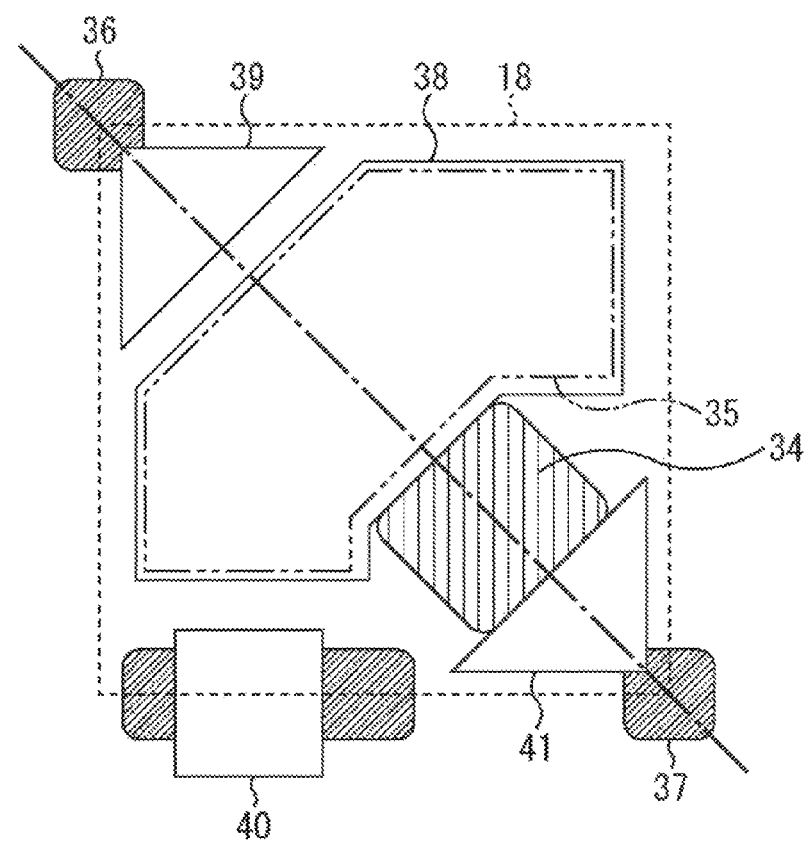
FIG. 14 is a diagram showing a planar example structure of a pixel.

Referring now to FIG. 14, an example planar structure of a pixel 18 is described.

FIG. 14 shows an example structure of a pixel 18 seen from the front surface side of the solid-state imaging device 11. Each of the drawings showing the above described example cross-section structures is a cross-sectional view taken along the dot-and-dash line shown in FIG. 14. Also, in FIG. 14, the memory unit 35 hidden by the gate electrode 38 is indicated by a double-dot-and-dash line, and the pixel 18 is designed to have such a layout that the memory unit 35 has the largest area among the elements formed in the plane including the memory unit 35. Thus, the saturation charge amount Qs in the memory unit 35 can be increased.

Note that, although one pixel 18 is shown in FIG. 14, the solid-state imaging device 11 may have a sharing pixel structure in which adjacent pixels 18 (such as four pixels 18) share an FD unit 36 and an overflow drain 37, for example. Further, the solid-state imaging device 11 may have a structure in which adjacent pixels 18 share an overflow drain 37 and the drain power supply of a pixel transistor (such as the amplifier transistor 26 in FIG. 1). With such a sharing pixel structure, the area occupied by the elements to be shared can be reduced, and the area of the memory unit 35 can be increased.

Also, in the solid-state imaging device 11, the FD unit 36 and the overflow drain 37 are disposed in positions that are diagonal from each other, as shown in FIG. 14. Thus, coupling can be avoided. Although not shown in the drawing, the solid-state imaging device 11 may also have a structure in which the FD unit 36 and the overflow drain 37 are disposed on the same side of the pixel boundaries, and the pixel transistor is disposed on the opposite side from that side.

Note that, the solid-state imaging device 11 of each of the above described embodiments can be used in various kinds of electronic apparatuses, such as imaging systems for digital still cameras and digital video cameras, portable telephone devices having imaging functions, and other apparatuses having imaging functions.

Figure 15:
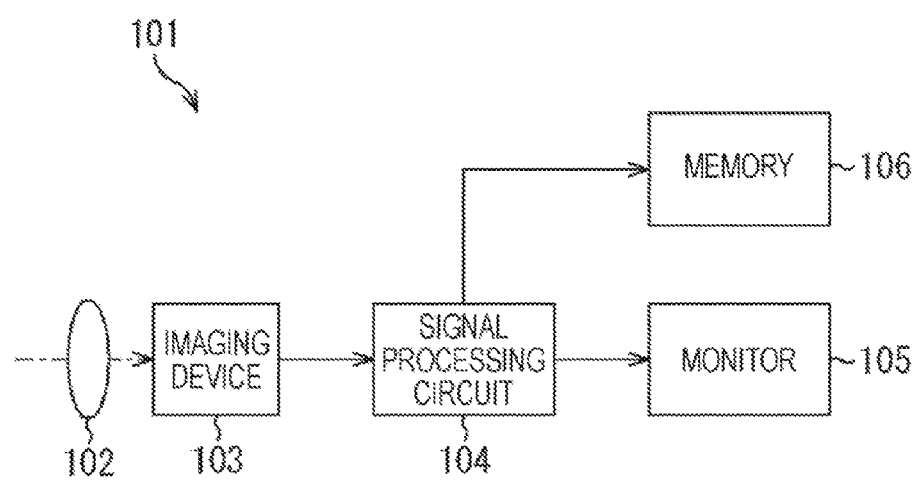
FIG. 15 is a block diagram showing an example structure of an imaging apparatus installed in an electronic apparatus.

FIG. 15 is a block diagram showing an example structure of an imaging apparatus installed in an electronic apparatus.

As shown in FIG. 15, an imaging apparatus 101 includes an optical system 102, an imaging device 103, a signal processing circuit 104, a monitor 105, and a memory 106, and can take still images and moving images.

The optical system 102 includes one or more lenses to guide light (incident light) from an object to the imaging device 103, and form an image on the light receiving surface (the sensor portion) of the imaging device 103.

The solid-state imaging device 11 of one of the above described embodiments and modifications is used as the imaging device 103. In the imaging device 103, electrons are accumulated for a certain period of time in accordance with an image to be formed on the light receiving surface via the optical system 102. Then, a signal in accordance with the electrons accumulated in the imaging device 103 is then supplied to the signal processing circuit 104.

The signal processing circuit 104 performs various kinds of signal processing on pixel signals that are output from the imaging device 103. The image (image data) obtained through the signal processing performed by the signal processing circuit 104 is supplied to and displayed on the monitor 105, or is supplied to and stored (recorded) into the memory 106.

Using the solid-state imaging device 11 of one of the above described embodiments and modifications, the imaging apparatus 101 having this structure can take images at a high frame rate, for example.

Note that, the present technology may also be embodied in the structures described below.

(1) A solid-state imaging device including:
a semiconductor substrate having pixels arranged in an array; and
a photoelectric conversion film that performs photoelectric conversion of light emitted from a first surface side of the semiconductor substrate,
wherein:
each of the pixels includes:
a charge accumulation layer that accumulates charge generated in the photoelectric conversion film, the charge accumulation layer being formed to be in contact with the photoelectric conversion film on the first surface of the semiconductor substrate; and
a transfer path unit that serves as the path to transfer the charge accumulated in the charge accumulation layer, the transfer path unit being formed to extend from the charge accumulation layer to a point near a second surface, the second surface facing the opposite side from the first surface of the semiconductor substrate; and
the photoelectric conversion film is formed by stacking a layer on the first surface of the semiconductor substrate, the layer being formed with a material having a great light blocking effect.

(2) The solid-state imaging device of (1), wherein the transfer path unit has a potential gradient, a potential becomes deeper in the direction from the charge accumulation layer toward the second surface of the semiconductor substrate.

(3) The solid-state imaging device of (1) or (2), wherein the transfer path unit is formed to have a smaller area than the charge accumulation layer when the semiconductor substrate is seen in a plan view.

(4) The solid-state imaging device of any of (1) through (3), wherein each of the pixels further includes
a memory unit that holds the charge transferred from the charge accumulation layer until the charge is read from the pixel, the memory unit being disposed near the second surface side of the semiconductor substrate, a charge transfer gate being interposed between the memory unit and the transfer path unit.

(5) The solid-state imaging device of any of (1) through (4), wherein each of the pixels further includes
an overflow drain formed on the first surface of the semiconductor substrate, the overflow drain being disposed on a different side of the transfer path unit from the side on which the memory unit is formed, a discharge gate being interposed between the overflow drain and the transfer path unit.

(6) The solid-state imaging device of (5), further including
a drive circuit that drives the pixels,
wherein the drive circuit drives the discharge gate of each of the pixels substantially at the same time, and collectively discharges the charge accumulated in the charge accumulation layers into the overflow drains.

(7) The solid-state imaging device of (5) or (6), wherein the cutoff potential of the discharge gate discharging the charge from the transfer path unit into the overflow drain is lower than the cutoff potential of the charge transfer gate transferring the charge from the transfer path unit to the memory unit.

(8) The solid-state imaging device of any of (1) through (7), wherein the photoelectric conversion film is a film formed with a compound lattice-matched to the semiconductor substrate.

(9) The solid-state imaging device of any of (1) through (8), wherein the photoelectric conversion film is a film formed with a silicide.

(10) The solid-state imaging device of any of (1) through (9), wherein the photoelectric conversion film is a film formed with an organic material.

(11) The solid-state imaging device of any of (1) through (10), further including
a buffer layer that reduces impurity diffusion, the buffer layer being disposed between the semiconductor substrate and the photoelectric conversion film.

(12) The solid-state imaging device of (5), wherein a pinning layer having a high concentration of an impurity is formed between the charge accumulation layer and the memory unit, the impurity being different from the impurity forming the charge accumulation layer and the memory unit.

(13) The solid-state imaging device of (12), wherein:
the charge accumulation layer and the pinning layer are formed on a silicon substrate forming the semiconductor substrate; and
the memory unit is formed in an epitaxial layer through epitaxial growth of silicon on the front surface of the silicon substrate.

(14) The solid-state imaging device of (12) or (13), wherein the memory unit is formed to extend from a point near the front surface of the semiconductor substrate to a point in contact with the pinning layer.

(15) The solid-state imaging device of any of (5) through (14), wherein an electrode for reading the charge from the memory unit is formed to extend from the front surface of the semiconductor substrate toward the inside of the semiconductor substrate, the electrode being in contact with a side surface of the memory unit.

(16) The solid-state imaging device of any of (12) through (15), wherein part of the pinning layer is formed to extend toward the front surface side of the semiconductor substrate, the part of the pinning layer covering a side surface of the memory unit.

(17) The solid-state imaging device of (16), wherein the part of the pinning layer is formed to separate the memory unit and the transfer path unit from each other.

(18) The solid-state imaging device of any of (5) through (17), wherein the pixel has a layout in which the memory unit has the largest area among the elements formed in the plane including the memory unit.

(19) A method of manufacturing a solid-state imaging device including: a semiconductor substrate having pixels arranged in an array; and a photoelectric conversion film that performs photoelectric conversion of light emitted from a first surface side of the semiconductor substrate,
each of the pixels including: a charge accumulation layer that accumulates charge generated in the photoelectric conversion film; and a transfer path unit that serves as the path to transfer the charge accumulated in the charge accumulation layer,
the method including the steps of:
forming the charge accumulation layer near the first surface of the semiconductor substrate;
forming the transfer path unit extending from the charge accumulation layer to a point near a second surface facing on the opposite side from the first surface of the semiconductor substrate;
performing polishing until the charge accumulation layer is exposed through the first surface side of the semiconductor substrate; and
forming the photoelectric conversion film by stacking a layer on the first surface of the semiconductor substrate, the layer being formed with a material having a great light blocking effect.

(20) An electronic apparatus including
a solid-state imaging device including:
a semiconductor substrate having pixels arranged in an array; and
a photoelectric conversion film that performs photoelectric conversion of light emitted from a first surface side of the semiconductor substrate,
wherein:
each of the pixels includes:
a charge accumulation layer that accumulates charge generated in the photoelectric conversion film, the charge accumulation layer being formed to be in contact with the photoelectric conversion film on the first surface of the semiconductor substrate; and
a transfer path unit that serves as the path to transfer the charge accumulated in the charge accumulation layer, the transfer path unit being formed to extend from the charge accumulation layer to a point near a second surface, the second surface facing the opposite side from the first surface of the semiconductor substrate; and
the photoelectric conversion film is formed by stacking a layer on the first surface of the semiconductor substrate, the layer being formed with a material having a great light blocking effect.

Note that, it should be noted that this embodiment is not limited to the above described embodiments, and various modifications may be made to them without departing from the scope of the present disclosure.

REFERENCE SIGNS LIST

11 Solid-state imaging device
12 Pixel region
13 Vertical drive circuit
14 Column signal processing circuit
15 Horizontal drive circuit
16 Output circuit
17 Control circuit
18 Pixel
21 PD
22 Memory transfer transistor
23 Memory unit
24 Transfer transistor
25 FD unit
26 Amplifier transistor
27 Select transistor
28 Reset transistor
29 Discharge transistor
31 Semiconductor substrate
32 Photoelectric conversion film
33 Charge accumulation layer
34 Transfer path unit
35 Memory unit
36 FD unit
37 Overflow drain
38 to 41 Gate electrode
51 Semiconductor substrate
52 Silicon substrate
53 Epitaxial layer
54 Buffer layer
55 Pinning layer

The invention claimed is:

1. A solid-state imaging device, comprising:
a semiconductor substrate having a plurality of pixels arranged in an array; and
a photoelectric conversion film configured to perform photoelectric conversion of light emitted from a first surface of the semiconductor substrate,
wherein:
each pixel of the plurality of pixels includes:
a charge accumulation layer configured to accumulate charge generated in the photoelectric conversion film, the charge accumulation layer being in contact with the photoelectric conversion film on the first surface of the semiconductor substrate;
a pinning layer disposed in the semiconductor substrate, to be in contact with the charge accumulation layer; and
a transfer path unit configured to serve as a path to transfer the charge accumulated in the charge accumulation layer, the transfer path unit being disposed to extend from the charge accumulation layer to a first point near a second surface, and is in contact with the pining layer,
the second surface facing an opposite side from the first surface of the semiconductor substrate; and
the photoelectric conversion film is formed by layer stacked on the first surface of the semiconductor substrate, the layer being disposed with a material having a great light blocking effect.

2. The solid-state imaging device according to claim 1, wherein the transfer path unit has a potential gradient, a potential becomes deeper in a direction from the charge accumulation layer toward the second surface of the semiconductor substrate.

3. The solid-state imaging device according to claim 1, wherein an area of the transfer path unit is smaller than an area of the charge accumulation layer when the semiconductor substrate is seen in a plan view.

4. The solid-state imaging device according to claim 1, wherein the each pixel of the plurality of pixels further includes a memory unit configured to hold the charge transferred from the charge accumulation layer until the charge is read from the each pixel of the plurality of pixels, the memory unit being disposed near the second surface of the semiconductor substrate, a charge transfer gate being interposed between the memory unit and the transfer path unit.

5. The solid-state imaging device according to claim 4, wherein the each pixel of the plurality of pixels further includes an overflow drain formed on the second surface of the semiconductor substrate, the overflow drain being disposed on a different side of the transfer path unit from a side having the memory unit formed thereon, a discharge gate being interposed on the second surface between the overflow drain and the transfer path unit.

6. The solid-state imaging device according to claim 5, further comprising a drive circuit configured to drive the plurality of pixels, wherein the drive circuit is further configured to drive the discharge gate of the each pixel of the plurality of pixels substantially at a same time, and collectively discharge the charge accumulated in the charge accumulation layer into the overflow drain.

7. The solid-state imaging device according to claim 5, wherein a first cutoff potential of the discharge gate that discharges the charge from the transfer path unit into the overflow drain is lower than a second cutoff potential of the charge transfer gate that transfers the charge from the transfer path unit to the memory unit.

8. The solid-state imaging device according to claim 1, wherein the photoelectric conversion film is a film formed with a compound lattice-matched to the semiconductor substrate.

9. The solid-state imaging device according to claim 1, wherein the photoelectric conversion film is a film formed with a silicide.

10. The solid-state imaging device according to claim 1, wherein the photoelectric conversion film is a film formed with an organic material.

11. The solid-state imaging device according to claim 1, further comprising a buffer layer configured to reduce impurity diffusion, the buffer layer being disposed between the semiconductor substrate and the photoelectric conversion film.

12. The solid-state imaging device according to claim 5, wherein the pinning layer has a high concentration of a first impurity and is formed between the charge accumulation layer and the memory unit, the first impurity being different from a second impurity forming the charge accumulation layer and the memory unit.

13. The solid-state imaging device according to claim 12, wherein: the charge accumulation layer and the pinning layer are formed on a silicon substrate forming the semiconductor substrate; and the memory unit is formed in an epitaxial layer by an epitaxial growth of silicon on a front surface of the silicon substrate.

14. The solid-state imaging device according to claim 12, wherein the memory unit is formed to extend from a second point near a front surface of the semiconductor substrate to a third point in contact with the pinning layer.

15. The solid-state imaging device according to claim 5, wherein an electrode to read the charge from the memory unit is formed to extend from a front surface of the semiconductor substrate toward the inside of the semiconductor substrate, the electrode being in contact with a side surface of the memory unit.

16. The solid-state imaging device according to claim 12, wherein part of the pinning layer is formed to extend toward a front surface side of the semiconductor substrate, the part of the pinning layer covering a side surface of the memory unit.

17. The solid-state imaging device according to claim 16, wherein the part of the pinning layer is formed to separate the memory unit and the transfer path unit from each other.

18. The solid-state imaging device according to claim 5, wherein the each pixel of the plurality of pixels has a layout in which the memory unit has a largest area among elements formed in a plane including the memory unit.

19. An electronic apparatus, comprising
a solid-state imaging device including:
    a semiconductor substrate having a plurality of pixels arranged in an array; and
    a photoelectric conversion film configured to perform photoelectric conversion of light emitted from a first surface of the semiconductor substrate,
    wherein:
    each pixel of the plurality of pixels includes:
        a charge accumulation layer configured to accumulate charge generated in the photoelectric conversion film, the charge accumulation layer being in contact with the photoelectric conversion film on the first surface of the semiconductor substrate;
        a pinning layer disposed in the semiconductor substrate, to be in contact with the charge accumulation layer; and
        a transfer path unit configured to serve as a path to transfer the charge accumulated in the charge accumulation layer, the transfer path unit being disposed to extend from the charge accumulation layer to a point near a second surface, and is in contact with the pining layer, the second surface facing an opposite side from the first surface of the semiconductor substrate; and
    the photoelectric conversion film is formed by stacking a layer stacked on the first surface of the semiconductor substrate, the layer being formed with a material having a great light blocking effect.

20. A solid-state imaging device, comprising:
a semiconductor substrate having a plurality of pixels arranged in an array; and
a photoelectric conversion film configured to perform photoelectric conversion of light emitted from a first surface of the semiconductor substrate,
wherein:
each pixel of the plurality of pixels includes:
    a charge accumulation layer configured to accumulate charge generated in the photoelectric conversion film, the charge accumulation layer being in contact with the photoelectric conversion film on the first surface of the semiconductor substrate;
    a transfer path unit configured to serve as a path to transfer the charge accumulated in the charge accumulation layer, the transfer path unit being formed to extend from the charge accumulation layer to a point near a second surface, the second surface facing an opposite side from the first surface of the semiconductor substrate, and wherein the photoelectric conversion film is formed by a layer stacked on the first surface of the semiconductor substrate, the layer being formed with a material having a great light blocking effect, a memory unit configured to hold the charge transferred from the charge accumulation layer until the charge is read from the each pixel of the plurality of pixels, the memory unit being disposed near the second surface of the semiconductor substrate, a charge transfer gate being interposed between the memory unit and the transfer path unit; and an overflow drain formed on the second surface of the semiconductor substrate, the overflow drain being disposed on a different side of the transfer path unit from a side having the memory unit formed thereon, a discharge gate being interposed on the second surface between the overflow drain and the transfer path unit.

* * * * *